United States Patent [19]

Wakefield et al.

[11] 3,821,040

[45] June 28, 1974

[54] FORMATION OF SHALLOW P-N JUNCTIONS IN PbSnTe BY DIRECT DIFFUSION

[75] Inventors: Shirley L. Wakefield; Vernon L. Lambert, both of Cincinnati, Ohio

[73] Assignee: Cincinnati Electronics Corporation, Cincinnati, Ohio

[22] Filed: Jan. 2, 1973

[21] Appl. No.: 320,170

[52] U.S. Cl. .................. 148/189, 148/186, 148/187, 148/1.5, 252/62.3 R

[51] Int. Cl. .................. H01l 7/44

[58] Field of Search ............ 148/186, 187, 189, 1.5; 252/62.3 R

[56] References Cited

UNITED STATES PATENTS

| | | | |
|---|---|---|---|
| 3,276,097 | 10/1966 | Cohen et al. | 148/189 X |
| 3,403,133 | 9/1968 | Fredrick et al. | 252/62.3 E |
| 3,554,818 | 1/1971 | Lambert et al. | 148/186 |
| 3,615,928 | 10/1971 | Wagner et al. | 148/172 |
| 3,673,063 | 6/1972 | Wakefield | 148/1.6 X |
| 3,718,511 | 2/1973 | Moulin | 148/171 |

*Primary Examiner*—G. T. Ozaki

*Attorney, Agent, or Firm*—Lowe, King & Price

[57] ABSTRACT

This invention is a method of forming a shallow, i.e., less than 1 micron ($\mu$), p-n junction by direct diffusion. The junction is in lead-tin-telluride for diodes which are subsequently used to produce infrared detectors. The junction is produced directly from a wafer without the necessity of using conventional time-consuming back etching. The steps of the method comprise taking wafers prepared as in U.S. Pat. No. 3,673,063, Production of Lead-Tin-Telluride Material for Infrared Detectors, annealing the sliced and polished wafers in the simultaneous presence of an inert gas below atmospheric pressure and of a metal-rich powder at a temperature well below the melting point of $[Pb_{1-x}Sn_x]Te$ for a short time to form a thin top layer of n material on the original p material.

7 Claims, No Drawings

FORMATION OF SHALLOW P-N JUNCTIONS IN PbSnTe BY DIRECT DIFFUSION

BACKGROUND

The present application is a continuation-in-part of our U.S. Pat. Application Ser. No. 130,490, filed April 1, 1971 now abandoned, entitled Production of Infrared Mesa Detectors with Shallow P-N Junctions by Direct Diffusion and assigned to Avco Corporation, the assignee of this application.

The production of shallow, i.e., less than 1 $\mu$, lead-tin-telluride junctions poses a difficult commercial problem.

Conventional methods of producing p-n junctions start from a wafer about 30 mils in thickness, which is mechanically ground to about 20 mils. The resulting wafer is equilibrated with a metal-rich source in a controlled environment until a layer of n-type material is diffused thereon. Parenthetically, the expression "metal-rich source" is terminology used in the PbSnTe art to indicate the source of a combined lead and tin concentration (>50 percent) which exceeds the tellurium concentration (<50 percent). The prior art forms a junction of about 5 to 10 $\mu$ deep and as the grinding operation causes damage to the crystal lattice of the soft alloy, prior art indicates this damage can best be removed by electroetching, also known as "back etching"; accordingly, the 5 to 10 micron thick diffused layer is back etched to a thickness of about 1 micron.

In the expression $[Pb_{1-x}Sn_x]Te$ x is usually less than 27 percent. Typically, in the detectors reduced to practice $x$ was equal to 20 percent. From a theoretical point of view, whenever the Sn concentration exceeds 30 percent $n$ material cannot be formed and thus the formation of a p-n junction would not be possible. (Semiconductors and Semimetals, R. K. Willardson and Albert C. Beer, Vol. 5; Academic Press: New York, 1970.)

BRIEF DESCRIPTION OF THE INVENTION

The present invention departs from the art, in the formation of high quality junctions at a depth of 1 micron or less below the surface of the wafer. This is accomplished in a carefully controlled environment, on a single crystal wafer of p type material. The invention may be regarded as a method of making a shallow lead-tin-telluride p-n junction for use in infrared detectors. This method includes the first step of doing the material preparation indicated in said U.S. Pat. No. 3,673,063. The invention includes the step of forming a single tellurium rich (greater than 50 percent Te) crystal boule of $[Pb_{1-x}Sn_x]Te$, slicing the boule into disc-shaped wafers about 40–50 mils thick, mechanically polishing the surface of said wafers, electrolytically polishing said surfaces to a mirror smooth finish, annealing to reduce the Hall carrier concentration, and second annealing the same with a metal-rich material (greater than 50 percent Pb and Sn) in an inert atmosphere under partial atmospheric pressure at a temperature below the crystal melting point, whereby a small amount of metal is diffused into the alloy under controlled conditions of vaporization.

DETAILED DESCRIPTION

An exemplary embodiment of the invention involves the direct diffusion of a shallow (e.g., 0.5 micron) p-n junction. Starting with a pre-alloyed single crystal boule approximately three inches long and one inch in diameter, the first step is to slice therefrom thin wafers of a thickness of 40 to 50 mils. The boule may be grown by the Bridgman process. This slicing is done with a conventional wire saw operating on the principle of a band saw with a fine slurry wetted abrasive performing the cutting operation. We found it satisfactory to use a 5 mil stainless steel wire, with an abrasive slurry of silicon carbide, glycerol, and water continuously directed at the area of the cut. Preferably, the boule is mounted so that it may move evenly and continuously in an arc towards the running wire with the movement mechanically controlled in order to avoid excessive damage to the crystal lattice.

Step 2 involves mechanically polishing the flat surfaces of the wafers to remove saw damage and to achieve a specific thickness which may be conveniently selected as 30 mils. This may be accomplished by mounting the wafers on a Buehler automatic polisher with beeswax using PAW paper on the wheel and 15 micron alumina and water sprayed on the wheel from a squeeze bottle. This step also flattens the wafers and tends to maintain the surfaces more nearly planar.

In Step 3 the wafers are further reduced in thickness to 20 to 25 mils using Norr's electroetch procedure, as described in Vol. 109 of the Journal of the Electrochemical Society, page 433 (1962). Contrasted with conventional methods, this involves a relatively mild treatment, which removes all mechanical surface damage from the wafers and simultaneously exposes the true crystal lattice structure therein.

At this point it is desirable to assess the condition of the surface to determine if the electroetching step has proceeded too far or not far enough. This is accomplished by the use of Laue back-reflection X-ray equipment of the type well known in the art by which an X-ray film of the surface is produced for microscopic examination. If the film shows the appropriate molecular spacing and small sharp individual reflection dots, then the precise electroetching treatment carried on can be repeated for subsequently treated wafers with the conviction that the same amount of material removal by electroetching (which may be regarded as electro polishing) can be safely achieved.

Step 4 is the annealing step, which is required to reduce Hall carrier concentration. This is accomplished by sealing the wafers with a 1 percent metal-rich $Pb_{1-x}Sn_xTe$ 30 mesh powder in a quartz ampoule which is thoroughly cleansed with HCl, HF, $H_2O$, and acetone, evacuated to $10^{-6}$ Torr and then filled with argon to a pressure of 300 Torr. Here 1 percent metal rich refers to 51 parts $[Pb_{1-x}Sn_x]$ and 49 parts Te. Using the previously mentioned value of x, the material formula will typically be $[Pb_{0.8}Sn_{0.2}]_{0.51}Te_{0.49}$.

The powder is desirably placed in the bottom of the ampoule and the wafers suitably supported thereabove. The wafers are then annealed in an oven at successively decreasing temperatures. Specifically, this can be done at 678°C for 3 days and then 607°C for 8 days. Care should be taken so that the oven shall have an isothermal region as long as the sample region of the ampoule. The ampoule is then removed and placed directly in another furnace set at 502°C. It is kept there for 44 hours. Alternatively, this last step wherein diffusion is accomplished can be speeded up by annealing at 520°C for 30 hours. This is also an isothermal annealing determined by thermocouple profiling. At the end of this time the ampoule is air quenched at room temperature by removing it from the oven.

Those skilled in the art will recognize that the Step 4 treatment reduces the carrier-concentration from $10^{18}cm^{-3}$ or higher to the neighborhood of $10^{15}cm^{-3}$ or to $10^{16}cm^{-3}$. The p-n junction is formed in the 500+ degree annealing step and the depth is then determined by angle-lapping and thermal probing and, with the parameters as indicated, will be found to be about 0.5 microns.

In the last annealing step of 44 hours at 502°C (or alternatively, 30 hours at 520°C), the p-n junction is formed. The top or n layer is approximately 0.5 micron thick and it is formed on the surface of the p wafer. It results from a change in the metal-Te ratio from excess tellurium to excess metal (meaning excess Pb and Sn) through filling of the lattice voids and forming lattice bonds. This technique gives extremely constant junction depths under easily controlled conditions. This junction depth permits the commercial fabrication of highly sensitive detectors with good producibility. It is noted that the 0.5 micron depth p-n junctions resulting from the above-described procedure are produced directly by diffusion and such junctions can be used to fabricate infrared sensitive diodes without the necessity of prior art back etching. The steps of the method are relatively simple and may be easily adapted to quantity production procedures.

It will also be noted that at the partial pressure provided within the ampoule, the annealing temperatures above noted are below the melting point of the lead-tin-telluride crystals, thereby avoiding deleterious vaporization. For example, the melting point of $Pb_{.8}Sn_{.2}Te$ is approximately 890°C.

Having thus described our invention, we claim:

1. The method of making shallow $[Pb_{1-x}Sn_x]Te$ junctions for infrared-responsive-diodes comprising alloying $[Pb_{1-x}Sn_x]Te$ into a boule, slicing the same into disc-shaped wafers, mechanically polishing the surfaces thereof, electrolytically polishing said surfaces, and then annealing the wafers with a metal-rich material in an inert atmosphere under low pressure said metal-rich material being a lead tin telluride material having a combined lead and tin concentration exceeding the tellurium concentration, whereby a small amount of the lead and tin is diffused into the alloy under closely controlled conditions of vaporization and lattice bonds are taken up.

2. The method according to claim 1 in which the metal-rich material is a 1 percent metal-rich $[Pb_{1-x}Sn_x]Te$ powder.

3. The method according to claim 1 in which the annealing is accomplished at 678°C for 3 days and 607°C for 8 days.

4. The method according to claim 3 in which annealed wafers are further treated at 520°C for 30 hours.

5. The method according to claim 4 in which the wafers are subsequently air-quenched.

6. The method according to claim 3 in which the annealed wafers are further treated at 502°C for 44 hours.

7. The method according to claim 6 in which the wafers are subsequently air-quenched.

* * * * *